(12) United States Patent
Kim

(10) Patent No.: US 12,081,852 B2
(45) Date of Patent: Sep. 3, 2024

(54) CAMERA MODULE HAVING A PORTION OF A SUBSTRATE DISPOSED BETWEEN A LIGHT SOURCE AND A HEAT SINK

(71) Applicant: LG INNOTEK CO., LTD., Seoul (KR)

(72) Inventor: Min Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 861 days.

(21) Appl. No.: 16/644,738

(22) PCT Filed: Sep. 21, 2018

(86) PCT No.: PCT/KR2018/011296
§ 371 (c)(1),
(2) Date: Oct. 28, 2021

(87) PCT Pub. No.: WO2019/059727
PCT Pub. Date: Mar. 28, 2019

(65) Prior Publication Data
US 2022/0070340 A1    Mar. 3, 2022

(30) Foreign Application Priority Data
Sep. 22, 2017  (KR) .......................... 10-2017-0122705

(51) Int. Cl.
*H04N 23/55* (2023.01)
*G03B 17/12* (2021.01)
(Continued)

(52) U.S. Cl.
CPC ............. *H04N 23/55* (2023.01); *G03B 17/12* (2013.01); *G03B 17/55* (2013.01); *H04N 23/57* (2023.01)

(58) Field of Classification Search
CPC ........ H04N 23/55; H04N 23/57; H04N 23/56; H04N 13/271; H04N 13/254; H04N 23/54;
(Continued)

(56) References Cited

U.S. PATENT DOCUMENTS 10,182,180 B2 *   1/2019   Ramseyer ............... H04N 23/51
2004/0132491 A1 *   7/2004   Kim ....................... H04N 23/55
                                                                   348/E5.025
(Continued)

FOREIGN PATENT DOCUMENTS

CN            1518384 A      8/2004
CN          101261983 A      9/2008
(Continued)

*Primary Examiner* — Luong T Nguyen
(74) *Attorney, Agent, or Firm* — Birch, Stewart, Kolasch & Birch, LLP

(57) ABSTRACT

The present embodiment relates to a camera module comprising: a substrate having a first region, a second region, and a first connection portion between the first region and the second region; a lens unit disposed in the first region of the substrate and including a lens holder in which a lens a lens barrel are disposed; a heat sink part disposed adjacent to the lens unit in the first region of the substrate; and a light source element disposed above the heat sink part and disposed in the second region of the substrate, wherein the lens unit is disposed on a first surface of the substrate, the light source element is disposed on a second surface of the substrate, the first connection portion is bent at the side surface of the heat sink part so as to connect the first region and the second region, the first connection portion includes a flexible substrate, and the flexible substrate is disposed between the first surface and the second surface of the substrate.

18 Claims, 6 Drawing Sheets

(51) Int. Cl.
*G03B 17/55* (2021.01)
*H04N 23/57* (2023.01)

(58) Field of Classification Search
CPC .................. G03B 17/12; G03B 17/55; G03B 2205/0046; G03B 30/00; G03B 2217/002; H05K 1/18; G02B 7/028
See application file for complete search history.

(56) References Cited

U.S. PATENT DOCUMENTS

| | | | |
|---|---|---|---|
| 2013/0215311 A1* | 8/2013 | Uemura | H04N 23/54 348/308 |
| 2013/0235364 A1 | 9/2013 | Kyung et al. | |
| 2014/0063302 A1* | 3/2014 | Shukla | H04N 23/57 348/E5.025 |
| 2015/0229912 A1 | 8/2015 | Masalkar et al. | |
| 2016/0073855 A1* | 3/2016 | Farr | A61B 1/0676 600/109 |
| 2016/0295193 A1 | 10/2016 | Van Nieuwenhove et al. | |
| 2017/0195531 A1* | 7/2017 | Warren | H04N 23/52 |

FOREIGN PATENT DOCUMENTS

| | | |
|---|---|---|
| CN | 107121886 A | 9/2017 |
| JP | 2004-215223 A | 7/2004 |
| JP | 2006-47449 A | 2/2006 |
| KR | 10-2004-0078317 A1 | 9/2004 |
| KR | 10-0587012 B1 | 6/2006 |
| KR | 10-0647015 B1 | 11/2006 |
| KR | 10-2010-0092203 A | 8/2010 |
| KR | 10-2013-0102400 A | 9/2013 |
| KR | 10-2014-0000078 A | 1/2014 |
| KR | 10-1422954 B1 | 7/2014 |
| KR | 10-2015-0052075 A | 5/2015 |
| KR | 10-2016-0045670 A | 4/2016 |

\* cited by examiner

CAMERA MODULE HAVING A PORTION OF A SUBSTRATE DISPOSED BETWEEN A LIGHT SOURCE AND A HEAT SINK

CROSS REFERENCE TO RELATED APPLICATIONS

This application is the National Phase of PCT/KR2018/011296 filed on Sep. 21, 2018, which claims priority under 35 U.S.C. § 119(a) to Patent Application No. 10-2017-0122705 filed in the Republic of Korea on Sep. 22, 2017, all of which are hereby expressly incorporated by reference into the present application.

TECHNICAL FIELD

The present embodiment relates to a camera module, and more particularly to a camera module comprising an image acquisition sensor and a light source.

BACKGROUND ART

The current trend is that researches on 3D cameras capable of acquiring distance information with an object, and particularly devices capable of acquiring a 3D depth image for facial recognition are recently on the increase.

Concomitant with the said trend, a ToF (Time-of-Flight) module has been introduced as a depth image acquisition device. The ToF module acquires a depth image by measuring a light flight time from a light reflected from an object to a light received by a light receiving part after an illuminating light is irradiated on the object.

However, the said method suffers from disadvantages in that noises and distortions are generated when a distance from an object is distanced to abruptly decrease accuracy with respect to depth information, and to reduce a correlation with respect to color image as well. In order to solve the aforesaid disadvantages, an attempt has been made where an RGB (Red, Green, Blue) module is adjacently disposed near to a ToF sensor to correct a depth image.

However, there arise other disadvantage in that manufacturing process of camera module and manufacturing costs are increased, and size and volume of a camera module are also increased because a separate PCB (Printed Circuit Board) is mounted on a RGB module to allow being disposed near to a ToF sensor.

DETAILED DESCRIPTION OF THE INVENTION

Technical Subject

It is an object of the present exemplary embodiment to minimize the size of a camera module by arranging a light source element, a ToF sensor and/or a RGB module altogether on an integrated PCB.

Technical Solution

In one general aspect of the present invention, there is provided a camera module comprising: a substrate having a first region, a second region, and a first connection part between the first region and the second region; a lens unit disposed in the first region of the substrate and comprising a lens holder in which a lens a lens barrel are disposed; a heat sink part disposed adjacent to the lens unit in the first region of the substrate; and a light source element disposed above the heat sink part and disposed in the second region of the substrate, wherein the lens unit is disposed on a first surface of the substrate, the light source element is disposed on a second surface of the substrate, the first connection part is bent at a lateral surface of the heat sink part so as to connect the first region and the second region, the first connection part includes a flexible substrate, and the flexible substrate is disposed between the first surface and the second surface of the substrate.

The first region and the second region of the substrate may share the flexible substrate.

The connection part may have a width smaller than a width of the first region and a width of the second region.

The camera module may further comprise: a third region formed at one side or the other side of the substrate to receive a power from outside; and a second connection part connecting the first region or the second region with the third region and comprising a flexible substrate, wherein the first region or the second region may receive a power from the third region through the second connection part.

The camera module may further comprise: at least one protrusion protrusively formed on an upper surface of the heat sink part; and at least one hole coupled with the protrusion by being formed on the substrate in order to correspond with the protrusion.

The camera module may further comprise: an adhesive member coupling the heat sink part with the second region of the substrate.

The lens holder may include a hook, and may be coupled at a distal end of the second region of the substrate with the hook.

The hook may include a first hook region protruding from an upper surface of the lens holder to a first direction, and a second hook region protruding from the first hook region to a second direction.

The camera module may further comprise: a ToF sensor disposed at an inside of the lens holder to be coupled with one surface of the first substrate.

Advantageous Effects

A camera module according to the present invention may minimize the size and volume of the camera module by arranging a light source element, a ToF sensor and/or an RGB module altogether on an integrated PCB.

Furthermore, the process of mutually coupling the conventional light source element, the ToF sensor and the RGB module after coupling the same to a separate PCB has been dispensed with, whereby an entire process is now decreased and manufacturing cost is also reduced.

Moreover, the TOF sensor can align all the optical axis of embedded lens unit, an optical axis of light source element and an optical axis of RGB module in parallel, and a distance between an optical axis of lens unit and an optical axis of light source element can be minimized whereby a camera module capable of photographing an image of high resolution can be manufactured.

BEST MODE

Figure 1:
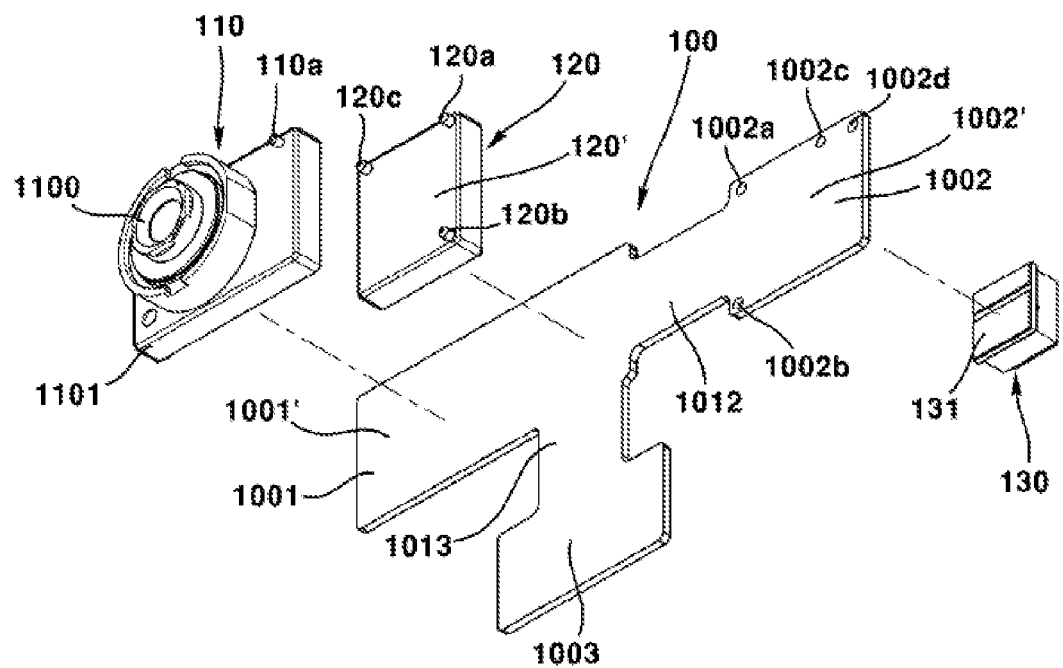
FIG. 1 is an exploded perspective view of a camera module according to an exemplary embodiment of the present invention.

Some exemplary embodiments of present invention will be described in detail with reference to the accompanying drawings. All the exemplary embodiments hereinafter explained should be understood to be merely exemplary in order to help understand the present invention, and the embodiments may, however, be embodied in many different forms and should not be construed as limited to the embodiments set forth herein. Furthermore, a detailed explanation of some relevant well-known function or well-known elements will be omitted while being explained in the exemplary embodiments of the present invention if obstructed in the understanding of the exemplary embodiment of present invention.

The accompanied drawings are not, however, to scale and may not precisely reflect or may exaggerate the precise structural dimensions, in order to help understand the present invention. In describing a reference numeral for each element, a same reference numeral will be designated, if possible, for the same element, albeit being differently indicated on other drawings.

Accordingly, the meaning of specific terms or words used in the specification and claims should not be limited to the literal or commonly employed sense, such as those defined in commonly used dictionaries, but should be construed or may be different in accordance with the intention of a user or an operator and customary usages. Therefore, the definition of the specific terms or words should be based on the contents across the specification.

In describing elements in the exemplary embodiments of the present invention, the terms, first, second, A, B (a), (b), etc., may be used. These terms may be used only to distinguish one element from another element, and the nature, order or sequence is not restricted by these terms. When an element is referred to as being "accessed to", "coupled to," or "connected to," another element, it should be appreciated that the element may be directly accessed, connected or coupled to the other element, or intervening elements may be present therebetween.

Thus, the configurations illustrated in the following detailed description of the embodiments and drawings are not intended to limit the scope of the invention, as claimed, but are merely representative of possible embodiments of the invention, and do not represent all the technical ideas of the present invention, such that various modified exemplary embodiments may be presented.

Figure 2:
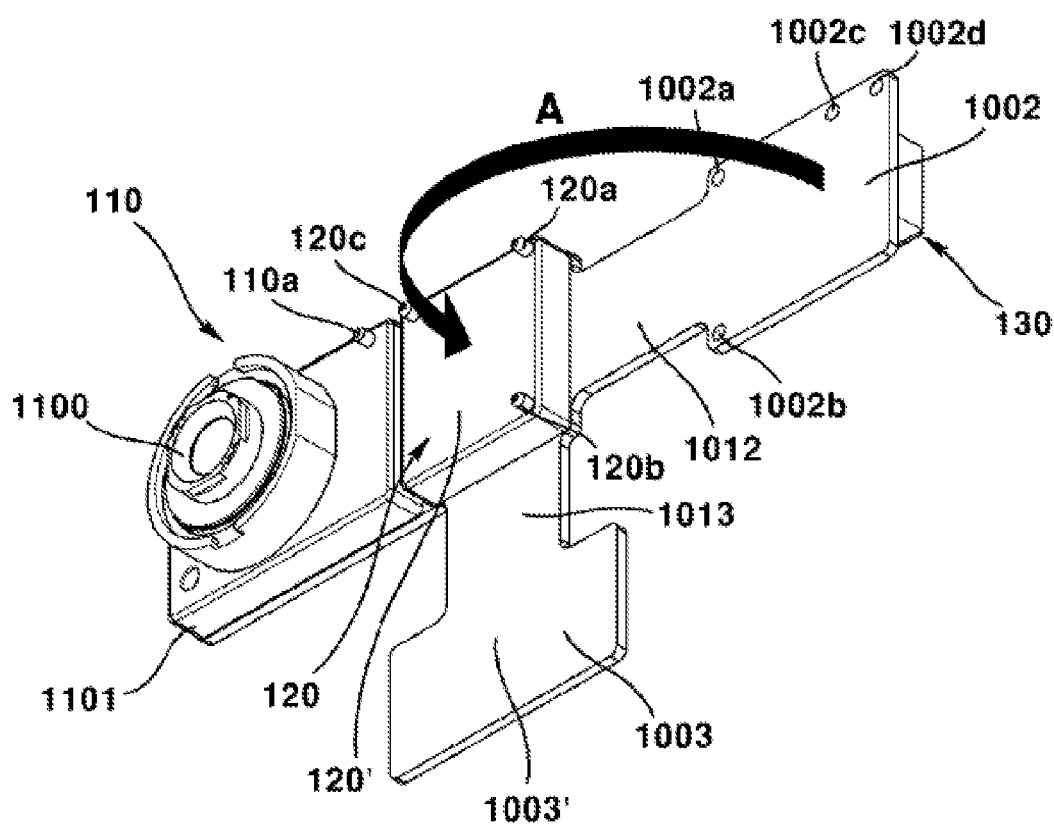
FIG. 2 is a schematic view illustrating a state where a second region of a substrate is rotated according to an exemplary embodiment of the present invention.
Figure 3:
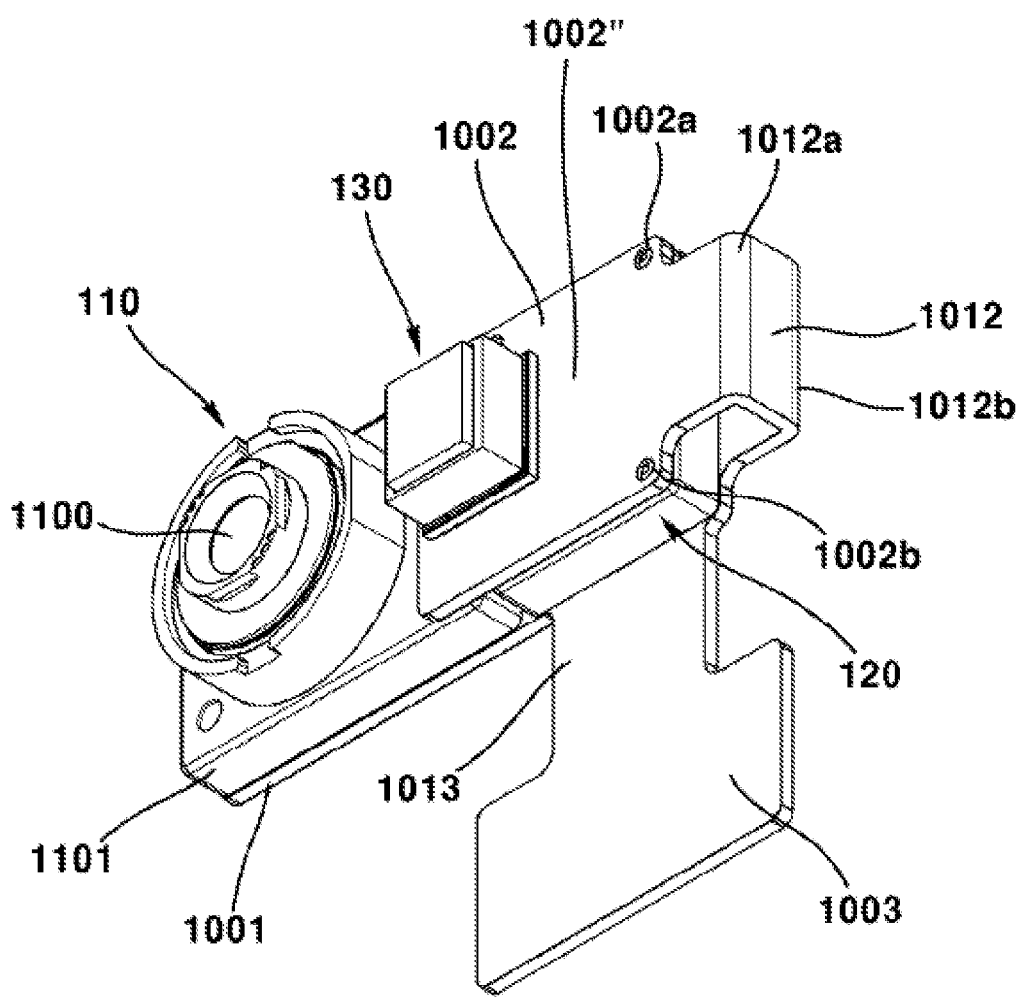
FIG. 3 is a schematic view illustrating a state where a second region of a substrate is brought into contact with an upper surface of a heat sink part according to an exemplary embodiment of the present invention.

FIG. 1 is an exploded perspective view of a camera module according to an exemplary embodiment of the present invention, FIG. 2 is a schematic view illustrating a state where a second region of a substrate is rotated according to an exemplary embodiment of the present invention, and FIG. 3 is a schematic view illustrating a state where a second region of a substrate is brought into contact with an upper surface of a heat sink part according to an exemplary embodiment of the present invention.

Referring to FIG. 1, a camera module according to an exemplary embodiment of the present invention may include a PCB (Printed Circuit Board, 100), a lens unit (110), a heat sink part (120), and a light source element (130).

The PCB (Printed Circuit Board, 100) according to an exemplary embodiment of the present invention may be used with a PCB widely used for conventional mobile electronic devices, and it is preferable that the PCB (100) be formed with an FPCB (Flexible Printed Circuit Board). In this case, the PCB (100) may be formed of a single surface PCB, a double-surfaced PCB, a multiple PCB or an R-F PCB (Rigid-Flex PCB).

The PCB (100) may include a first region, a second region and a third region, and may include a first connection part and a second connection part. The first to third regions may be thicker than the first and second connection parts because of being formed with many more layers. Furthermore, the first to third regions may have a broader area than that of the first connection part and the second connection part. The first connection part and the second connection part may be formed with two or four conductive layers (e.g., copper foil layer), and the first to third regions may be formed with many more conductive layers (e.g., four or six copper foil layers) than that of the first connection part and the second connection part.

The lens unit (110) may include at least one lens barrel (1100) and a lens holder (1101) configured to hold the lens barrel (1100). The lens holder (1101) may include a bracket protrusively and upwardly formed from an upper surface of the lens holder (1101) capable of holding the lens barrel (1100). The lens unit (110) generally includes a plurality of lenses in consideration of lens image forming, aberration correction or zoom function). A MLA (Micro Lens Array, MLA) is formed by repeatedly arranging and aggregating a plurality of lenses thus mentioned. Furthermore, an inside of lens holder (1101) is disposed with a ToF sensor to concentrate lights by allowing the lights received from the MLA to be collected on the ToF sensor.

A heat sink part (120) may be generally made of aluminum, silver or a copper, and may include a plurality of ribs for efficient heat dissipation. However, it is not that the heat sink part (120) must be made of a plurality of ribs but that the heat sink part (120) may be formed without ribs. The heat sink part may be formed at a lower surface with holes and a substrate region disposed underneath the heat sink part may be disposed with circuit elements.

A light source element (130) may be formed with an LED (Light Emitting Diode), an LD (Laser Diode) and an SLD (Super Luminescent Diode) emitting infrared rays or near-infrared rays. Moreover, the light source element (130) may be formed by further comprising other optical members for irradiating a frequency-modulated light to an object, adjusting a path of an irradiated light or forming a pattern.

Referring to FIG. 1, the PCB (100) may include a first region (1001), a second region (1002) and a third region (1003). The second region (1002) may be connected to one side of the first region (1001) through the first connection part (1012), and the third region (1003) may be connected to the other side of the first region (1001) through the second connection part (1013). However, the positional relationship between the second region (1002) and the third region (1003) is not limited thereto, and the second region (1002) and the third region (1003) may be all formed on the same lateral surface of the first region (1001). However, when the second region (1002) and the third region (1003) are connected to the same lateral surface of the first region (1001), the first connection part (1012) and the second connection part (1013) may be preferably spaced apart.

That is, the first region (1001) or the second region (1002) may be connected to the third region by the second connection part (1013), and the first region (1001) or the second region (1002) may receive a power from the third region (1003) through the second connection part (1013).

Moreover, the first connection part (1012) may be preferable to have a width narrower than that of the first region, the second region and the third region (1001, 1002, 1003) in terms of savings for the manufacturing cost.

As illustrated in FIG. 1, the first region (1001), the second region (1002) and the third region (1003) may be all formed with an integrated substrate. Furthermore, the first to third regions (1001, 1002, 1003), the first connection part (1012) and the second connection part (1013) may be all preferably formed with an FPCB.

One surface (1001') of first region may be mounted with a lens unit (110). In addition, a heat sink part (120) may be mounted on the said one surface (1001') of first region adjacent to the lens holder (1101) of lens unit.

Although an upper surface (120') of heat sink part may be added with an adhesive member, if necessary, to promote fixation after contact with one surface (1002') of second region, it is not essential to add an adhesive member to the upper surface (120') of the heat sink part. The adhesive member may be preferably used with a double-sided tape in the aspect of economy and mass production.

One surface (1002') of second region may be coated with epoxy resin, which is to allow the one surface (1002') of second region and the upper surface (120') of heat sink part to be fixed after being contacted therebetween, where a double-side tape may be additionally adhered in addition to coating of epoxy resin to the one surface (1002') of second region.

The other surface (1002", see FIG. 3) of second region may be mounted with a light source element (130), and the other surface (1002") of second region and a bottom surface (131) of light source element may be respectively disposed with a circuit element to allow the second region (1002) and the light source element (1003) to be electrically connected. The circuit element at this time may be preferably disposed in a pattern shape.

One surface (1003') of third region may be brought into contact with a main board of mobile electronic device such as mobile phone, whereby the said one surface (1003') of third region may be disposed with a circuit element. The circuit element at this time may be preferably disposed in a pattern shape as in the second region (1002).

Referring to FIG. 2, the second region (1002) may be rotated to an arrow A direction to allow the one surface (1002') of second region to contact the upper surface (120') of heat sink part. At this time, because the second region (1002) is rotated to an arrow A direction to allow the first connection part (1012) to be bent, the first connection part (1012) may be preferably formed with an FPCB. A height of the upper surface (120') of heat sink part may be substantially same as that of the upper surface of lens holder from which a bracket part of lens holder starts to protrude. As a result, a portion of substrate may be simultaneously disposed with an upper surface of lens holder and an upper surface of heat sink part, and an upper surface of heat sink part and an upper surface of lens holder may be coupled by a substrate.

In order to allow one surface (1002') of second region to be fixed to an upper surface (120') of heat sink part after being contacted therebetween, the second region (1002) may be formed with at least one hole, and an upper surface (120') of heat sink part may be also protrusively formed with at least one protrusion.

Referring to FIG. 2, the second region (1002) may be formed with a first hole (1002*a*), a second hole (1002*b*) and a third hole (1002*c*), and an upper surface (120') of heat sink part may be formed with a first protrusion (120*a*), a second protrusion (120*b*) and a third protrusion (120*c*). These protrusions and holes are formed to restrict a force of rotating to an opposite direction of arrow A direction by elasticity or restoring force returning to an original shape of the first connection part (1012) having flexibility. However, the number of holes and protrusions, positions or shapes may not be limited to the present description or portrayal in the drawings, and the holes and protrusions may not be formed on the second region (1002) and on the upper surface (120') of heat sink part. However, the protrusions and holes must be mutually and correspondingly formed.

Now, operations of holes and protrusions are explained. Each of the first protrusion (120*a*), the second protrusion (120*b*) and the third protrusion (120*c*) may be formed at a mutually corresponding positions with the first hole (1002*a*), the second hole (1002*b*) and the third hole (1002*c*) of second region (1002), and when the second region (1002) is rotated to an arrow A direction, the first protrusion (120*a*), the second protrusion (120*b*) and the third protrusion (120*c*) may be coupled with the first hole (1002*a*), the second hole (1002*b*) and the third hole (1002*c*). Through the mutual coupling between the holes and the protrusions, the first connection part (1012) is restricted of rotation to an opposite direction of the arrow A.

Furthermore, in order to restrict the rotation to an opposite direction of arrow A of the first connection part (1012), an additional protrusion (110*a*) may be formed on an upper surface (111) of lens holder, and an additional hole (1002*d*) may be also formed on the second region (1002). However, the additional protrusion (110*a*) and the additional hole (1002*d*) are not to be necessarily formed, and the number of holes, positions or shapes may not be limited to the present description or figures in the drawings. Although the present exemplary embodiment has described that the heat sink part or the lens holder is formed with protrusions, and the substrate is formed with a groove to allow a mutual coupling therebetween, it is possible that, conversely, the heat sink part or the lens holder may be formed with a groove and the substrate may be formed or disposed with a protrusion for coupling.

After one surface (1002') of second region is contacted to the upper surface (120') of heat sink part, the upper surface (120') of heat sink part may be fixed by the one surface (1002') of second region by the epoxy resin coated on the second region. As a result, as shown in FIG. 3, a camera module may be produced.

Referring to FIG. 3, the first connection part (1012) connecting the first region (1001) and the second region (1002) may take a bent shape because the second region (1002) is rotated to arrow A direction of FIG. 2 to allow being fixed on an upper surface (120') of heat sink part. At this time, the first connection part (1012) may be formed with at least one bent part, and according to an exemplary embodiment of FIG. 3, two bent parts may be formed such as a first bent part (1012*a*) and a second bent part (1012*b*). However, the shape or the number of bent part formed on the first connection part (1012) is not limited to the present description or to the accompanied drawings. Furthermore, the first connection part (1012) may be formed with a smooth round bent shape in response to the rotation of the second region (1002) to the arrow A direction, and in this case, a bent part may not be formed.

As illustrated in FIG. 3, when the first region (1001) and the second region (1002) are integrally formed, and the other surface (1002") of second region is attached to the light source element (130) to allow the other surface (1002") of second region to be fixed on the upper surface (120') of heat sink part by the rotation of the second region (1002), the lens unit (110) and the light source element (130) may be automatically aligned on the same straight line, and at this time, an optical axis of lens barrel (1100) and an optical axis of light source element (130) may be aligned in parallel. Furthermore, a distance between an optical axis of lens barrel (1100) and an optical axis of light source element (130) may be minimized to allow achieving a more effective result in the camera module photographing a high resolution image.

Now, a camera module according to another exemplary embodiment of the present invention will be described. However, explanation of same portions or parts as in the exemplary embodiment will be briefly explained or omitted. Furthermore, wherever possible, the same reference numerals as in the exemplary embodiment will be used to refer to the same or like parts. Recurrent configurations may be omitted in illustration.

Figure 4:
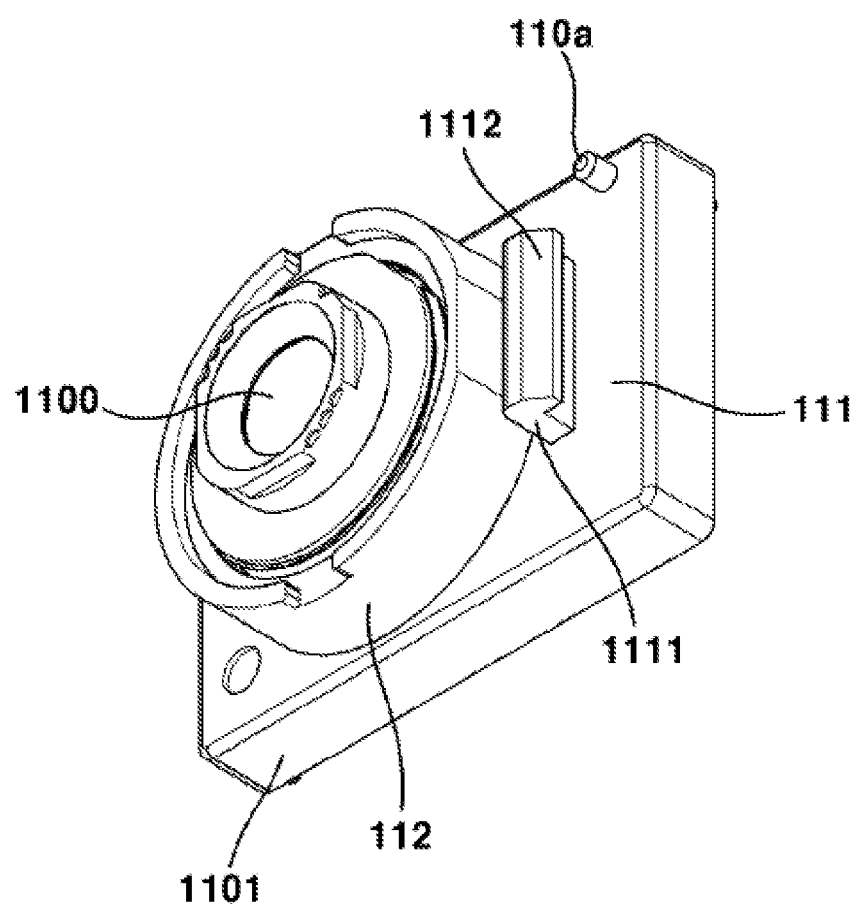
FIG. 4 is a perspective view illustrating a lens holder according to another exemplary embodiment of the present invention.
Figure 5:
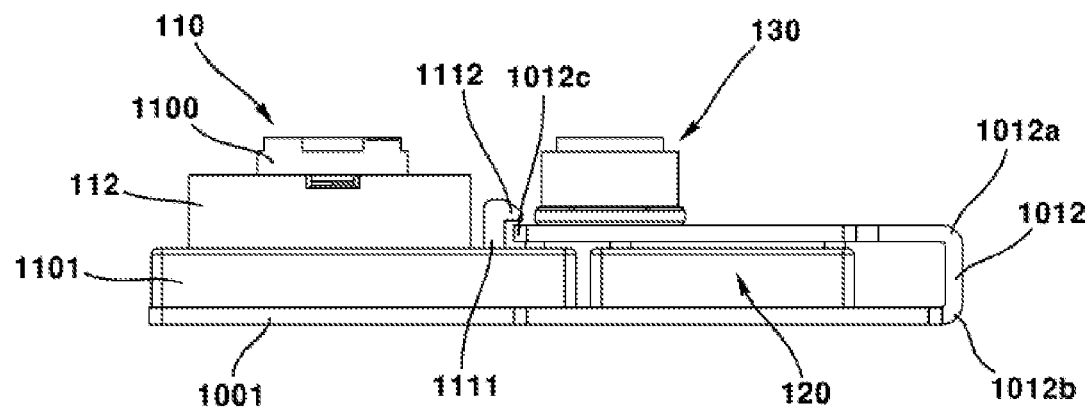
FIG. 5 is a schematic view illustrating a state where a second region of a substrate is coupled to a lens holder according to another exemplary embodiment of the present invention.

FIG. 4 is a perspective view illustrating a lens holder according to another exemplary embodiment of the present invention, and FIG. 5 is a schematic view illustrating a state where a second region of a substrate is coupled to a lens holder according to another exemplary embodiment of the present invention.

Referring to FIG. 4, a lens holder (1101) according to another exemplary embodiment of the present invention may include a hook. The hook may be disposed on an upper surface of lens holder (1101) with a reverse 'L' shape.

The hook may include a first hook region (1111) protrusively formed from an upper surface (111) of the lens holder to a first direction facing an upper side, and a second hook region (1112) hitched by one end (1012c) of the second region by being extended from the first hook region (1111). At this time, the second hook region (1112) may be protruded to a direction perpendicular to the first direction. Furthermore, the said one end (1012c) of the second region is formed by a distal end to be coupled to a hitching part (1112) of hook, which may be preferable in effectively restricting the rotation of the second region (1002).

As shown in FIG. 4, it is preferable that the first hook region (1111) be formed near to a lens holder reception part (112) formed on an upper surface (111) of lens holder. This is to allow the second region (1002) mounted with the light source element (130) to be closer to a lens holder (1102) side, as the first hook region (1111) is nearer to the lens holder reception part (112), whereby a distance between an optical axis of the lens barrel (1100) and an optical axis of the light source element (130) can be minimized. However, the disposition of the first hook region (1111) is not limited by the description of the present embodiment and the portrayal of drawings. The lens holder (1101) may include a lens holder reception part (112) protruded from an upper surface to accommodate the lens.

The second hook region (1112) may be formed at a right angle with the first hook region (1111) to be protrusively extended from the first hook region (1111) to a second region (1002) side direction. Furthermore, the lens holder (1101), the first hook region (1111) and the second hook region (1112) may form a kind of groove in response to an angle formed by the second hook region (1112) and the first hook region (1111).

As a result, as shown in FIG. 5, when the second region (1002) is rotated to an arrow A direction, one end (1012c) of second region is hitched by the groove formed by the lens holder (1101), the first hook region (1111) and the second hook region (1112) where the second region (1002) may be completely restricted in rotation to an opposite direction of arrow A direction by the elasticity or restoring force of the first connection part.

Now, a camera module according to another exemplary embodiment of the present invention will be described. However, explanation of same portions or parts as in the exemplary embodiment will be briefly explained or omitted. Furthermore, wherever possible, the same reference numerals as in the exemplary embodiment will be used to refer to the same or like parts. Recurrent configurations may be omitted in illustration.

Figure 6:
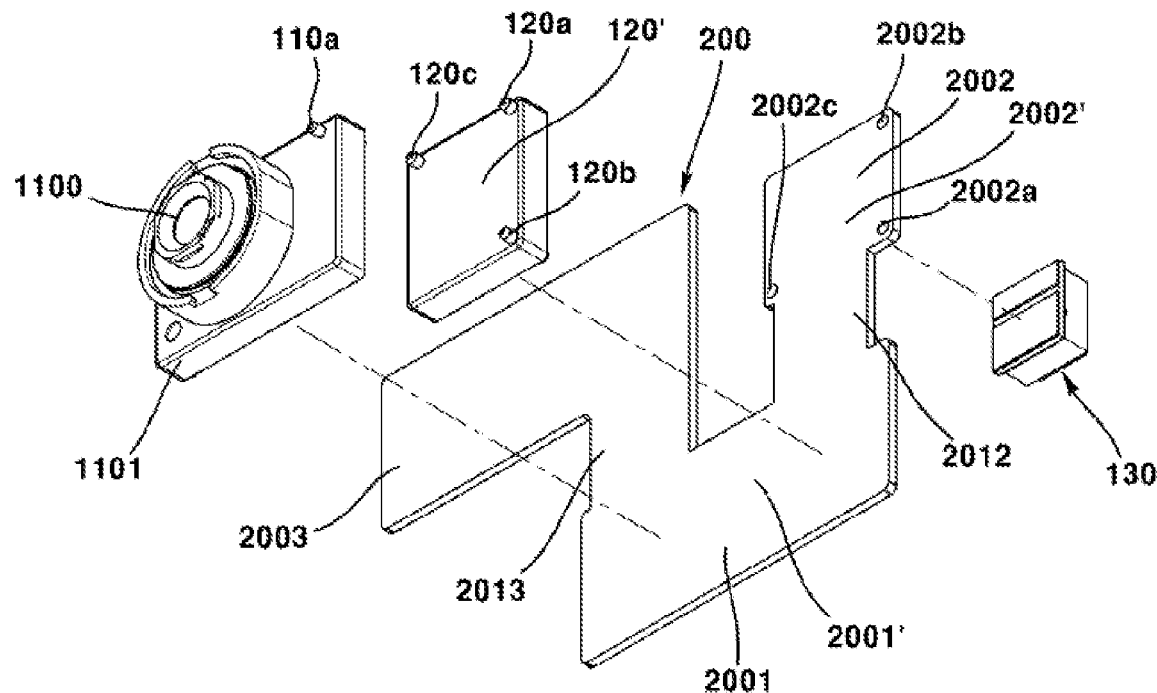
FIGS. 6 and 7 are exploded perspective views of a camera module according to still another exemplary embodiment of the present invention.
Figure 7:
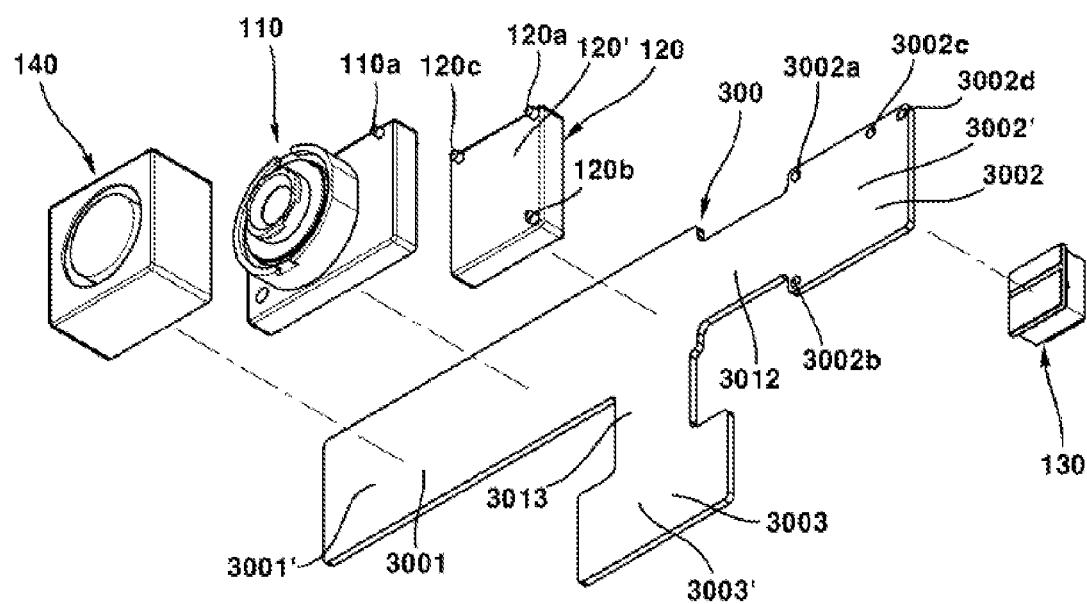

FIGS. 6 and 7 are exploded perspective views of a camera module according to still another exemplary embodiment of the present invention.

Referring to FIG. 6, a PCB (200) according to still another exemplary embodiment of the present invention may include a first region (2001), a second region (2002) and a third region (2003).

The second region (2002) and the third region (2003) may be all connected respectively to the first connection part (2012) and the second connection part (2013) on the same lateral surface of the first region (2001) through the first connection part (2012) and the second connection part (2013). In this case, as shown in FIG. 6, the first connection part (2012) and the second connection part (2013) respectively connecting the second region (2002) and the third region (2003) to the first region (2001) may be mutually spaced apart.

In particular, as an exemplary embodiment showing that positions of the third region (2003) connected to a main board of a mobile electronic device can be variably disposed, it can be shown that a camera module comprising a PCB (200) according to still another exemplary embodiment of the present invention may be disposed at various places comprising an edge part, a left end and a right end of a mobile electronic device.

The PCB (200) according to still another exemplary embodiment of the present invention may be used with a PCB widely used for general mobile electronic devices, and it is preferable that the PCB (200) be formed with an FPCB. In this case, the PCB (200) may be formed with a single surfaced PCB, a double-sided PCB or a multiple-surfaced PCB, or an R-F PCB (Rigid-Flex PCB).

As shown in FIG. 6, the PCB (200) according to still another exemplary embodiment of the present invention may be integrally formed with the first region (2001), the second region (2002) and the third region (2003), and one surface (2001') of the first region may be mounted with a lens unit (110). Furthermore, a heat sink part (120) may be mounted on the one surface (2001') of the first region adjacent to the lens holder (1101) of the lens unit.

One surface (2002') of second region may be coated with an epoxy resin as an adhesive member. This is to allow fixing the one surface (2002') of second region to an upper surface (120') of the heat sink part after being contacted therebetween. In addition to coating the epoxy region to the one surface (2002') of second region, a double-sided tape may be used as an additional adhesive member.

A light source element (130) may be mounted on the other surface of second region, which is an opposite surface of the one surface (2002') of the second region, and the other surface of the second region may be disposed with circuit elements for being electrically connected with a bottom surface (131) of the light source element. The said circuit element may be preferably disposed in a pattern type.

Furthermore, the second region (2002') may be formed with a first hole (2002a), a second hole (2002b) and a third hole (2002c). These holes are formed to restrict a force rotating to an opposite direction of arrow A by elasticity or restoring force of the first connection part (1012) of flexibility returning to an original shape, and may be coupled with a first protrusion (120a), a second protrusion (120b) and a third protrusion (120c) formed on an upper surface (120') of heat sink part. However, the number, positions or shapes of holes and the protrusions are not limited to the description of the present explanation or portrayal of the accompanying drawings, and therefore, holes and protrusions may be formed on the second region (2002) and an upper surface (120') of heat sink part.

One surface (2003') of third region is brought into contact with a main board of a mobile electronic device such as a smart phone, such that the said one surface (2003') of third region may be also disposed with a circuit element. The said circuit element may be preferably disposed in a pattern type.

Referring to FIG. 7, a PCB (300) according to still another exemplary embodiment of the present invention may include an extensively formed first region (3001), a second region (3002) and a third region (3003).

As illustrated in FIG. 7, the first region (3001) may be further extended to a direction distancing from the second region mounted with the light source element (130). An RGB module (140) may be additionally mounted on one surface (3001') of first region adjacent to the lens holder (1101).

The RGB module (140) is mounted to obtain a high resolution image by more accurately correcting a depth image obtained by measuring a distance from a camera module to an object through a ToF sensor, and it is preferable that the RGB module (140) be adjacently disposed with the lens unit (110) mounted with the ToF sensor.

Furthermore, in order to allow the RGB module to implement the correction relative to the ToF sensor accurately for obtainment of high resolution depth image, an optical axis of lens barrel (1100) included in the lens unit (110) and an optical axis of RGB module (140) must be mutually aligned in parallel, such that the RGB module (140) must be adjacently disposed with the lens holder (1101) of lens unit (110).

However, the RGB module (140) must be maximally spaced apart from the light source element (130), because the RGB module (140) may be interfered by a light generated from the light source element (130).

Therefore, as illustrated in FIG. 7, although the RGB module (140) is maximally spaced apart from the light source element (130), it is preferable that the RGB module (140) be adjacently disposed with the lens holder (1101).

Each of the second region (3002) and the third region (3003) is connected to the first region (3001) through a first connection part (3012) and a second connection part (3013), and the first region (3001), the second region (3002) and the third region (3003) may be all integrally formed.

In this case, the PCB (300) is preferably formed with an FPCB, and may be formed with a single surfaced PCB, a double-sided PCB or a multiple-surfaced PCB, or an R-F PCB (Rigid-Flex PCB).

The camera module according to still another exemplary embodiment of the present invention illustrated in FIG. 7 may be mounted at one surface (3001') of first region with a lens unit (110). Furthermore, a heat sink part (120) may be mounted on the one surface (3001') of the first region adjacent to the lens holder (1101) of the lens unit.

One surface (3002') of second region according to still another exemplary embodiment of the present invention may be coated with an epoxy resin as an adhesive member. This is to allow fixing the one surface (3002') of second region to an upper surface (120') of the heat sink part after being contacted therebetween. In addition to coating the epoxy region to the one surface (3002') of second region, a double-sided tape may be used as an additional adhesive member.

Furthermore, the second region (3002') may be formed with a first hole (3002a), a second hole (3002b) and a third hole (3002c). These holes are formed to restrict a force rotating to an opposite direction of arrow A by elasticity or restoring force of a first connection part (3012) of flexibility returning to an original shape, and may be coupled with a first protrusion (120a), a second protrusion (120b) and a third protrusion (120c) formed on an upper surface (120') of heat sink part. However, the number, positions or shapes of holes and the protrusions are not limited to the description of the present explanation or portrayal of the accompanying drawings, and therefore, holes and protrusions may not be formed on the second region (3002) and an upper surface (120') of heat sink part.

Furthermore, in order to restrict rotation to an opposite direction of arrow A of a first connection part (3012), an additional protrusion (110a) may be formed on an upper surface (111) of lens holder, and the second region (3002) may be also formed with an additional hole (3002d). However, the additional protrusion (110a) and the additional hole (3002d) need not to be necessarily formed and the number, positions or shapes are not limited to the present description of portrayal of the drawings.

The other surface of second region, which is an opposite surface of the one surface (3002') of second region may be mounted with a light source element (130), and the other surface of the second region may be disposed with a circuit element for being electrically connected to a bottom surface (131) of the light source element. The said circuit element may be preferably disposed in a pattern type.

One surface (3003') of third region is brought into contact with a main board of a mobile electronic device such as a smart phone, such that the said one surface (3003') of third region may be also disposed with a circuit element. The said circuit element may be preferably disposed in a pattern type.

The camera module according to still another exemplary embodiment of the present invention is such that an integrated PCB is disposed together with a light source element, a ToF sensor and/or a RGB module to minimize the size and volume of camera module, and at the same time, to dispense with an unnecessary processes of mutual connection by attaching a ToF sensor and a RGB module, whereby an entire process can be reduced to thereby decrease the manufacturing cost and manufacturing time.

Moreover, an optical axis of lens unit embedded with a ToF sensor, an optical axis of light source element and an optical axis of RGB module can be all aligned in parallel, and a distance between an optical axis of lens unit and an optical axis of light source element can be minimized whereby a camera module capable of photographing a high resolution image can be manufactured.

It should be interpreted that the terms such as "includes", "comprising", "have", "having", "comprises" and/or "comprising" as used herein mean that the relevant elements are embedded, unless otherwise described, such that the mentioned elements are not excluded but may be further included. Unless otherwise defined, all terms comprising technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein. The foregoing various exemplary embodiments of the present invention and explanations are intended only to be illustrative of the technical ideas of the present invention, and therefore, it should be appreciated by the skilled in the art that various modifications and amendments to the above examples may be made without deviating from the scope of protection of the invention.

Thus, the exemplary embodiments disclosed by the present invention are not to limit the technical ideas of the present invention but to explain the present invention, and therefore, the technical ideas of present invention are not to be limited by the exemplary embodiments. The scope of protection of the present invention should be interpreted by the following claims and all technical ideas within the equivalent scope should be interpreted as being included in the scope of right of the present invention.

The invention claimed is:

1. A camera module comprising:
a substrate comprising a first region, a second region, and a first connection part connecting the first region and the second region;
a lens unit disposed on the first region of the substrate and comprising a lens;
a heat sink part disposed on the first region of the substrate; and
a light source element disposed above at least one of the lens unit and the heat sink part and disposed on the second region of the substrate,
wherein the lens unit is disposed on a first surface of the substrate and the light source element is disposed on a second surface of the substrate opposite to the first surface of the substrate,
wherein the first connection part comprises a flexible substrate,
wherein the flexible substrate of the first connection part is bent so as to connect the first region and the second region,
wherein the heat sink part comprises a first coupling part formed on an upper surface of the heat sink part, and
wherein the substrate comprises a second coupling part formed on the second region of the substrate and coupled with the first coupling part.

2. The camera module of claim 1, wherein a portion of the second region of the substrate is disposed between the light source element and the heat sink part.

3. The camera module of claim 1, wherein the first region and the second region of the substrate share the flexible substrate.

4. The camera module of claim 1, wherein the first connection part has a width smaller than one of a width of the first region and a width of the second region.

5. The camera module of claim 1, wherein the substrate comprises a third region receiving a power from outside, and a second connection part connecting at least one of the first region and the second region with the third region and comprising a flexible substrate, and
wherein at least one of the first region and the second region receives a power from the third region through the second connection part.

6. The camera module of claim 1, comprising an adhesive member coupling the heat sink part and the second region of the substrate.

7. The camera module of claim 1, wherein the lens unit comprises a lens holder accommodating at least a portion of the lens,
wherein the lens holder comprises a hook, and
wherein a distal end of the second region of the substrate is coupled to the hook.

8. The camera module of claim 7, wherein the hook comprises a first hook region protruding from an upper surface of the lens holder in a first direction, and a second hook region protruding from the first hook region in a second direction different from the first direction.

9. The camera module of claim 1, wherein the first coupling part of the heat sink part comprises a protrusion protruding from the upper surface of the heat sink part,
wherein the second coupling part of the substrate comprises a hole, and
wherein the protrusion of the heat sink part is inserted into the hole of the substrate.

10. The camera module of claim 1, wherein the heat sink part is disposed adjacent to the lens unit, and
wherein the substrate is integrally formed as one body.

11. The camera module of claim 1, wherein the light source element comprises a first part overlapped with the lens unit in an optical axis of the lens and a second part overlapped with the heat sink part in the optical axis.

12. The camera module of claim 1, wherein the lens unit comprises a lens holder accommodating at least a portion of the lens,
wherein the lens unit comprises a third coupling part formed on an upper surface of the lens holder, and
wherein the substrate comprises a fourth coupling part formed on the second region of the substrate and coupled with the third coupling part.

13. The camera module of claim 12, wherein the third coupling part comprises a protrusion protruding from the upper surface of the lens holder,
wherein the fourth coupling part of the substrate comprises a hole, and
wherein the protrusion of the lens holder is inserted into the hole of the substrate.

14. The camera module of claim 1, wherein the lens unit comprises a lens holder accommodating at least a portion of the lens, and
wherein a height of the lens holder is same as a height of the heat sink part.

15. A camera module comprising:
a substrate comprising a first region, a second region, and a first connection part connecting the first region and the second region, wherein each of the first region, the second region and the first connection part comprises a first surface and a second surface opposite to the first surface;
a lens unit disposed on the first surface of the first region;
a heat sink disposed on the first surface of the first region; and a light source disposed on the second surface of the second region, wherein the first connection part comprises a flexible substrate, wherein the flexible substrate of the first connection part is curvedly formed to connect the first region and the second region, wherein the first surface of the second region is coupled to at least one of the lens unit and the heat sink, wherein the heat sink is overlapped with the light source in a direction parallel to an optical axis of the light source, wherein the heat sink is not overlapped with the lens unit in the direction parallel to the optical axis of the light source, wherein the heat sink comprises a first coupling part formed on an upper surface of the heat sink, and wherein the substrate further comprises a second coupling part formed on the second region of the substrate and coupled with the first coupling part.

16. The camera module of claim 15, wherein the first surface of the second region is directly coupled to at least one of the lens unit and the heat sink.

17. The camera module of claim 15, wherein the first coupling part of the heat sink comprises a protrusion protruding from the upper surface of the heat sink, wherein the second coupling part of the substrate comprises a hole, and wherein the protrusion of the heat sink is inserted into the hole of the substrate.

18. A camera module comprising:

a substrate integrally formed as one body and comprising a first region, a second region, and a first connection part connecting the first region and the second region;

a lens unit disposed on the first region of the substrate;

a heat sink disposed on the first region of the substrate; and a light source disposed on the second region of the substrate, wherein the first connection part comprises a flexible substrate, wherein the second region of the substrate is disposed on an upper surface of the heat sink so that the heat sink is disposed between the first region of the substrate and the second region of the substrate, wherein the flexible substrate of the first connection part is bent to connect the first region and the second region, and wherein the second region of the substrate is disposed between the light source and the heat sink.

* * * * *